United States Patent
Lee

(10) Patent No.: US 7,020,029 B2
(45) Date of Patent: Mar. 28, 2006

(54) SEMICONDUCTOR MEMORY DEVICE FOR PREVENTING SKEW AND TIMING ERROR OF OUTPUT DATA

(75) Inventor: Kang-Youl Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/745,738

(22) Filed: Dec. 23, 2003

(65) Prior Publication Data

US 2005/0094442 A1    May 5, 2005

(30) Foreign Application Priority Data

Oct. 31, 2003   (KR) .................... 10-2003-0076829

(51) Int. Cl.
*G11C 7/00*    (2006.01)
(52) U.S. Cl. .............................. 365/189.05; 365/230.08
(58) Field of Classification Search ........... 365/189.05, 365/189.04, 191, 230.08
See application file for complete search history.

(56) References Cited

U.S. PATENT DOCUMENTS

| 5,805,504 | A | * | 9/1998 | Fujita ................. 365/189.05 |
| 6,101,136 | A | * | 8/2000 | Mochida ................ 365/194 |
| 6,757,212 | B1 | * | 6/2004 | Hamamoto et al. ......... 365/233 |

\* cited by examiner

*Primary Examiner*—Thong Q. Le
(74) *Attorney, Agent, or Firm*—Blakely Sokoloff Taylor & Zafman

(57) ABSTRACT

A semiconductor memory device includes at least memory cell block which has a plurality of memory cells and outputs a plurality of data signals in response to a read command signal; a data latching unit for latching and outputting the plurality of data signals in response to a data output control signal generated in response to the read command signal; a data selection unit for selecting a data output mode from the plurality of data output modes in response to a data selection signal and for outputting data corresponding to the selected data output mode; and a data output control unit for outputting a data selection signal to the data selection unit in response to the data output control signal.

6 Claims, 8 Drawing Sheets

SEMICONDUCTOR MEMORY DEVICE FOR PREVENTING SKEW AND TIMING ERROR OF OUTPUT DATA

FIELD OF INVENTION

The present invention relates to a semiconductor memory device; and, more particularly, to a semiconductor memory device for preventing skew and timing error of output data.

DESCRIPTION OF PRIOR ART

FIG. 1 shows a block diagram showing a conventional semiconductor memory device.

As shown, the conventional semiconductor memory device includes a command decoder 10, a command execution controlling unit 20, a memory cell block 30, a data latching unit 40, a data selection unit 50, a pipe registering unit 60, a data output driver 70 and an address delaying unit 80.

The command decoder 10 receives and decodes a plurality of command signals such as a chip selection bar signal /CS, a row address strobe bar signal /RAS, a column address strobe bar signal /CAS and a write enable bar signal /WE in order to output a read command signal RD.

The command execution controlling unit 20 generates a read command execution signal CASP_RD and a data output control signal IO_CTRL in response to the read command signal RD outputted from the command decoder 10.

The memory cell block 30 includes a plurality of memory cells and outputs first to sixteenth data signals D0 to D15 corresponding to inputted first to eleventh address signals A0 to A10 in response to the read command execution signal CASP_RD. The data latching unit 40 latches and amplifies the first to sixteenth data signals D0 to D15 outputted from the memory cell block 30 in order to output first to sixteenth delayed data signals D0_D to D15_D in response to the data output control signal IO_CTRL.

The address delaying unit 80 delays twelfth and thirteenth address signals A11 and A12 to output a first delayed address signal A11_D and a second delayed address signal A12_D. The data selection unit 50 selects signals from the first to sixteenth delayed data signals D0_D to D15_D outputted from the data latching unit 40 in response to a data mode selection signal X4/X8/X16 in order to output the selected data signals to the pipe registering unit 60.

Herein, generally, the conventional semiconductor memory device can select one of the three data modes: a X4 mode, a X8 mode and X16 mode. These X4, X8 and X16 data modes respectively allow simultaneous inputting/outputting of 4-bit data, 8-bit data and 16-bit data.

The pipe registering unit 60 receives data signals outputted from the data selection unit 50 to output the received data signals in synchronization with a first delayed locked loop (DLL) clock signal RCLK_DLL and a second DLL clock signal FCLK_DLL.

The data output driver 70 receives outputted data signals from the pipe registering unit 60 to output the received data to outside of the conventional semiconductor memory device.

FIG. 2 is a block diagram showing the data latching unit 40 and an X8 data selecting unit 50-2.

Herein, the data selection unit 50 includes an X4 data selecting unit 50-1, the X8 data selecting unit 50-2 and an X16 data selecting unit 50-3 for use in the X4 mode, in the X8 mode and in the X16 mode respectively. FIG. 2 shows the X8 data selecting unit 50-2 assuming that the conventional semiconductor memory device is in the X8 mode.

As shown, the data latching unit 40 includes sixteen unit data latching units, i.e., a first unit data latching unit 40-1 to a sixteenth unit data latching unit 40-16. The X8 data selecting unit 50-2 includes eight unit data selecting units, i.e., a first unit data selecting unit 50-2-1 to an eighth unit data selecting unit 50-2-8.

The unit data latching units receives the first to sixteenth data signals D0 to D15 to amplify and output the received D0 to D15 in response to the data output control signal IO_CTRL. Each of the unit data selecting units receives two of the first to sixteenth data signals D0 to D15 and selects one of the two received signals to output in response to the first delayed address signal A11_D.

The second delayed address signal A12_D is inputted to the X4 data selecting unit 50-1 in addition to the first delayed address signal A11_D to select four data signals from sixteen data signals at the X4 mode.

FIG. 3 is a circuit diagram showing the address delaying unit 80 shown in FIG. 1.

As shown, the address delaying unit 80 includes a plurality of inverters I1 to I6 and a plurality of capacitors C1 to C8.

The inverters I1 to I6 are connected serially each other. The capacitors are connected between a power supply voltage VDD and a ground VSS. The circuit diagram shown in FIG. 3 only shows a circuit for the twelfth address signal A_11, but a circuit for the thirteenth address signal A_12 is the same.

FIGS. 4 and 5 are timing diagram showing a data transferring operation of the conventional semiconductor memory device at the X8 mode.

The data transferring operation is described below referring to FIGS. 1 to 5.

The command decoder receives and decodes the chip selection bar signal /CS, the row address strobe bar signal /RAS and the write enable bar signal /WE in order to output the read command signal RD. The command execution controlling unit 20 receives the RD to output the read command execution signal CASP_RD.

The memory cell block 30 outputs the first to sixteenth data signals D0 to D15 corresponding to the first to eleventh address signals A0 to A10 in response to the read command execution signal CASP_RD.

The data latching unit 40 receives the first to sixteenth data signals D0 to D15 from the memory cell block 30 to amplify the received data signals and to output the first to sixteenth delayed data signals D0_D to D0_15.

The data selection unit 50 receives the first to sixteenth delayed data signals D0_D to D15_D and selects 4 or 8 or 16 signals from the first to sixteenth delayed data signals D0_D to D15_D depending on the data mode selection signal X4/X8/X16.

The pipe registering unit 60 receives data signals from the data selection unit 50 and output them by synchronizing the received signals with the first and second DLL clock signals RCLK_DLL and FCLK_DLL. Generally, the conventional semiconductor memory device is operated in synchronization with an external clock signal. The pipe registering unit 60 serves to output data signals in synchronization with the external clock signal by using the first and second DLL clock signals RCLK_DLL and FCLK_DLL.

Referring to FIG. 2, each of the eight unit data selecting units included in the X8 data selecting unit 50-2 receives two of the first to sixteenth data signals D0 to D15 and selects one of the received two data signals to output in response to the first delayed address signal A11_D.

Referring to FIG. 4, if command signals are inputted in synchronization with an external clock signal CLK, the read command signal RD is generated. Then, the command execution controlling unit 20 generates the data output control signal IO_CTRL and the read command execution signal CASP_RD in response to the read command signal RD.

Thereafter, the memory cell block 30 outputs the first to sixteenth data signals D0 to D15 in response to the read command execution signal CASP_RD. The data latching unit 40 receives the first to sixteenth data signals D0 to D15 from the memory cell block 30 to output the received signals as the first to sixteenth delayed data signals D0_D to D15_D in synchronization with the data output control signal IO_CTRL.

The address delaying unit 80 receives the twelfth address signal A11 to delay it for a predetermined time and output the delayed signal as the first delayed address signal A11_D, wherein the predetermined time is marked as "X" in FIG. 4.

The X8 data selecting unit 50-2 selects one of the first and second delayed data signals D0_D and D1_D, and selects one of the third and fourth delayed data signals D0_2 and D0_3, and so on in response to the first delayed address signal A11_D. For example, if the A11_D is in a logic 'LOW' level, the delayed data signals D0_D, D2_D, . . . and D14_D are selected; however, if the A11_D is in a logic 'HIGH' level, the delayed data signals D1_D, D3_D, . . . and D15_D are selected.

The first to thirteenth address signals A0 to A12 are inputted in synchronization with the read command signal RD.

The first to eleventh address signals A0 to A10 are inputted the memory cell block 30 for the first to sixteenth delayed data signals D0_D to D15_D being outputted to the data selection unit 50. However, since the twelfth address signal A11 is not inputted to the memory cell block 30, the A11 has to be delayed for the predetermined time.

As shown in FIG. 3, the address delaying unit 80 delays the twelfth address signal A11 by using inverters and capacitors.

However, due to characteristics of the inverters and the capacitors, the predetermined time can be changed by operational conditions such as a thermometer and a voltage level.

If the predetermined time is changed, there occurs a skew between outputted data signals from the data selection unit 50 and outputted data signals from the data latching unit 40. This skew is marked as "Y" in FIG. 5.

Therefore, there occurs a data output error if the operational conditions are changed in the conventional semiconductor memory device.

SUMMARY OF INVENTION

It is, therefore, an object of the present invention to provide a semiconductor memory device for outputting data signals without an error.

In accordance with an aspect of the present invention, there is provided a semiconductor memory device including at least memory cell block which has a plurality of memory cells and outputs a plurality of data signals in response to a read command signal; a data latching unit for latching and outputting the plurality of data signals in response to a data output control signal generated in response to the read command signal; a data selection unit for selecting a data output mode from the plurality of data output modes in response to a data selection signal and for outputting data corresponding to the selected data output mode; and a data output control unit for outputting a data selection signal to the data selection unit in response to the data output control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
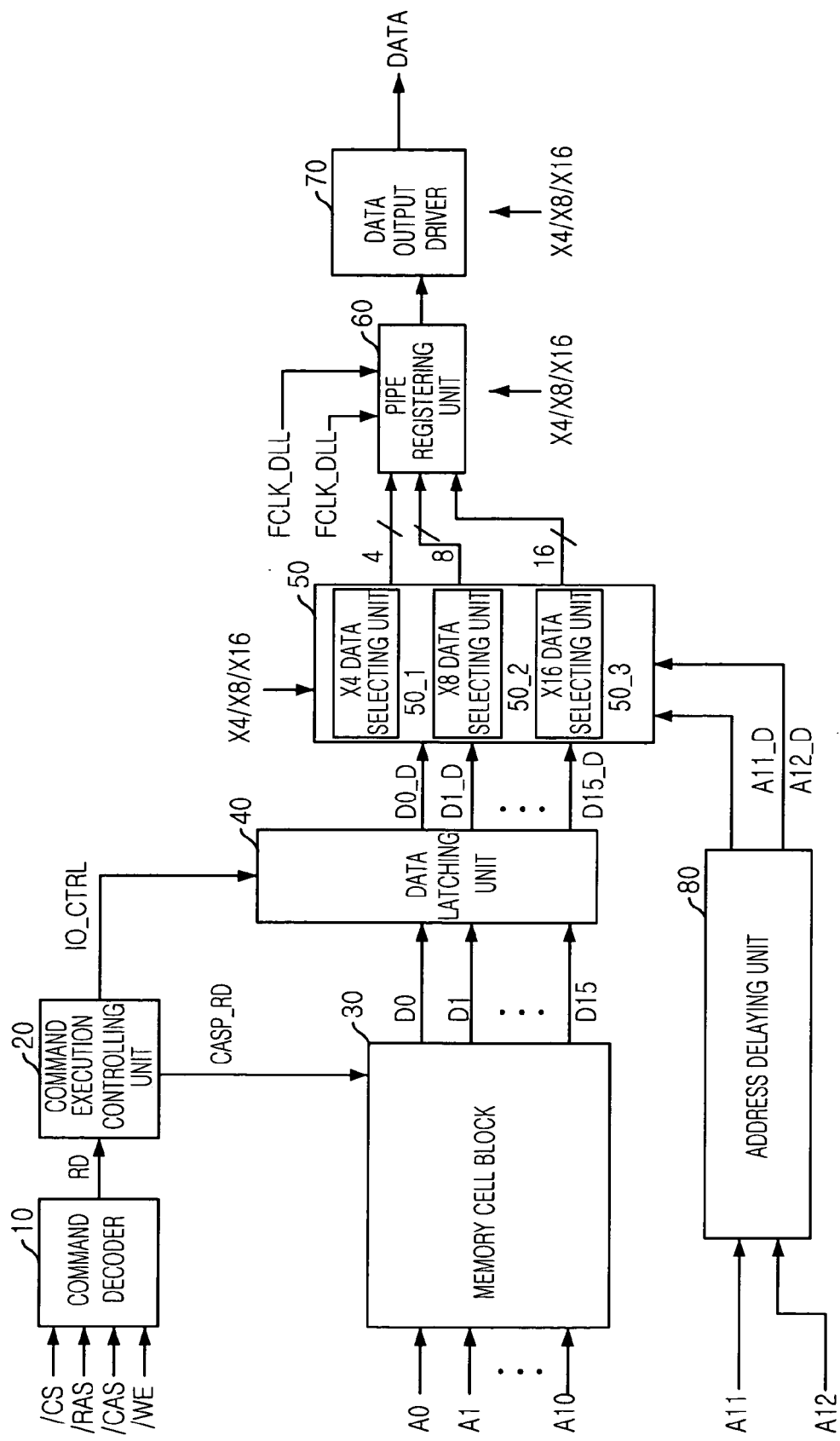
FIG. 1 shows a block diagram showing a conventional semiconductor memory device.
Figure 2:
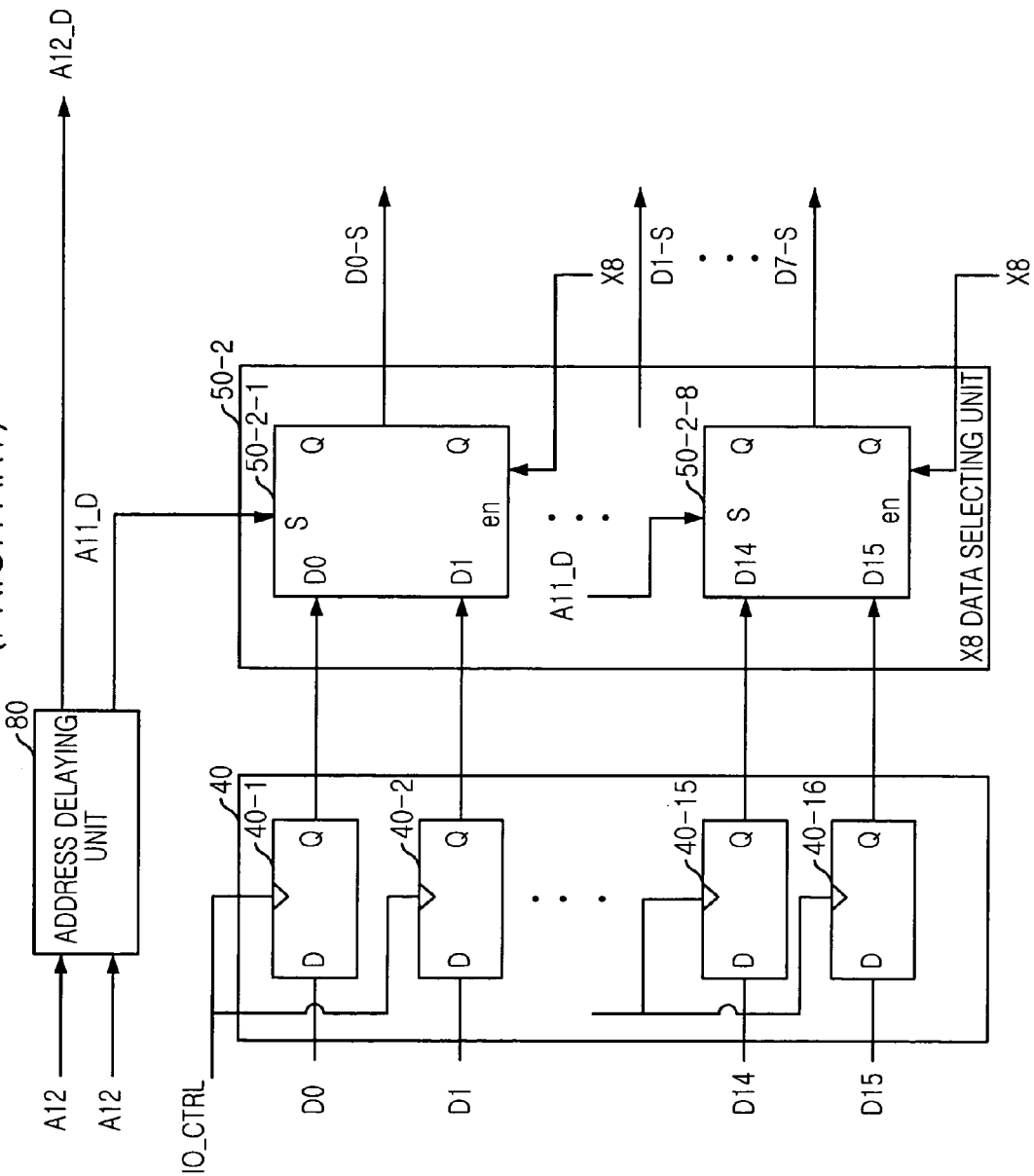
FIG. 2 is a block diagram showing a data latching unit and an X8 data selecting unit shown in FIG. 1.
Figure 3:
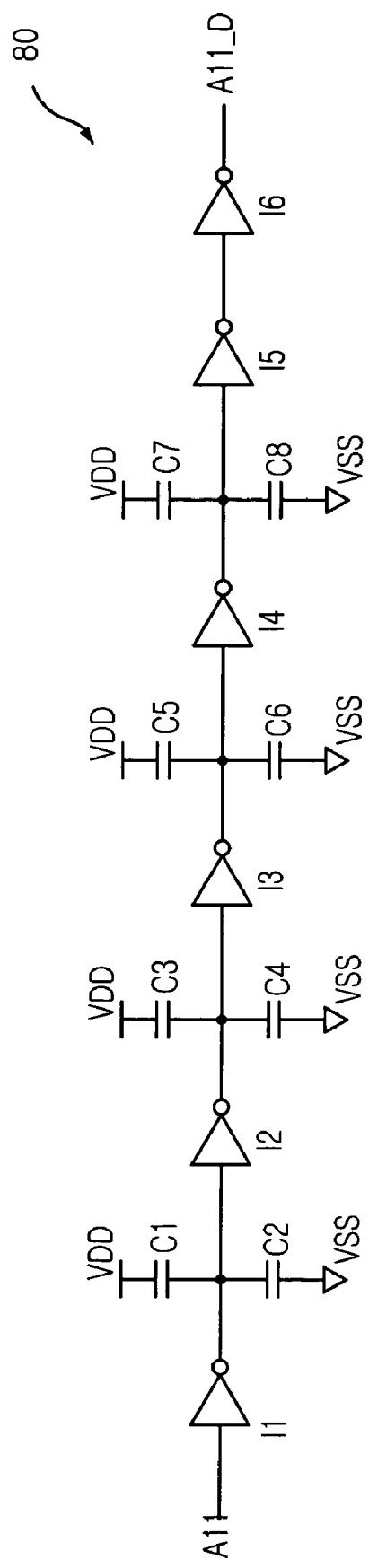
FIG. 3 is a circuit diagram showing an address delaying unit shown in FIG. 1.
Figure 4:
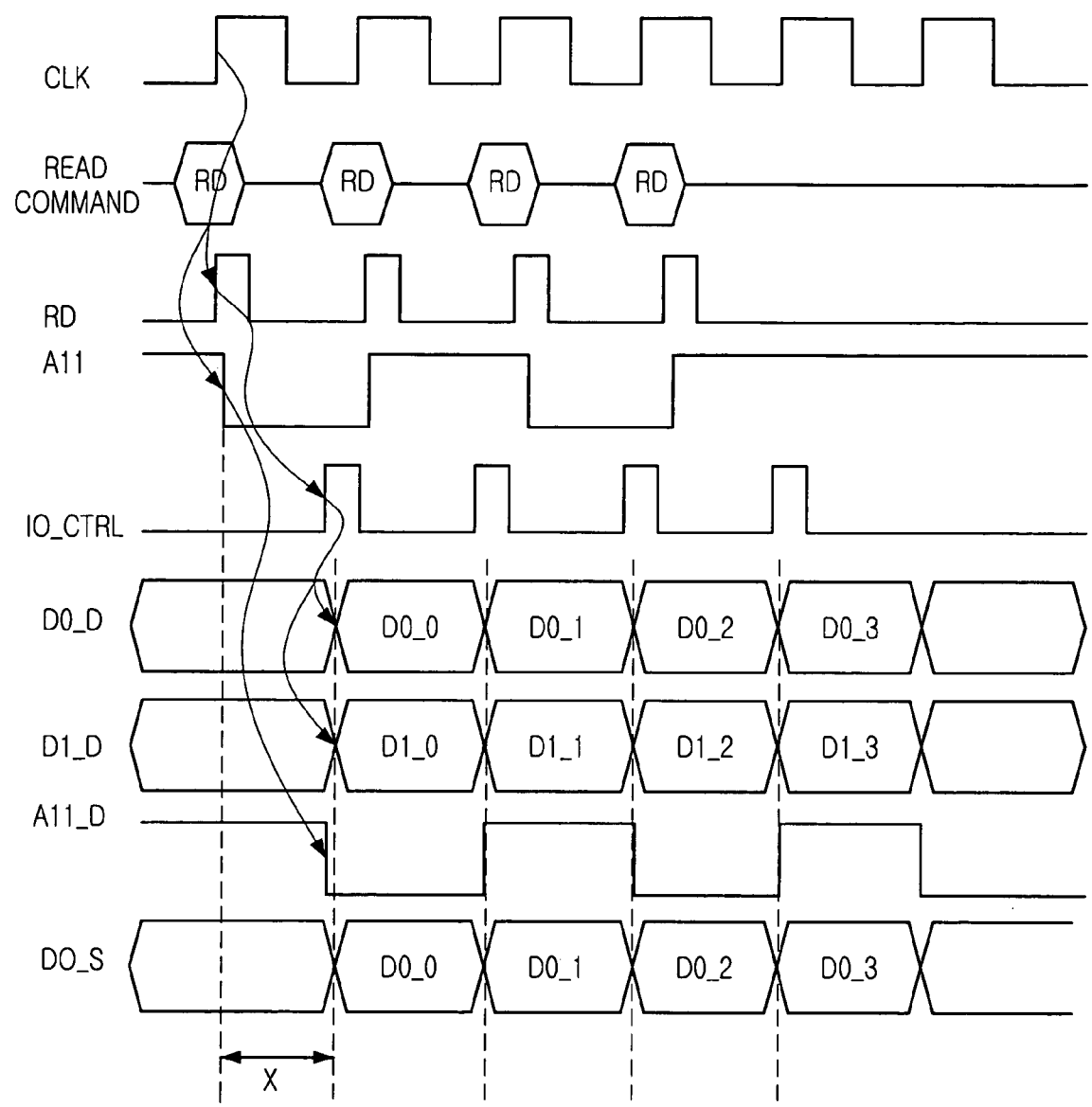
FIGS. 4 and 5 are timing diagrams showing a data transferring operation of the conventional semiconductor memory device at an X8 mode.
Figure 5:
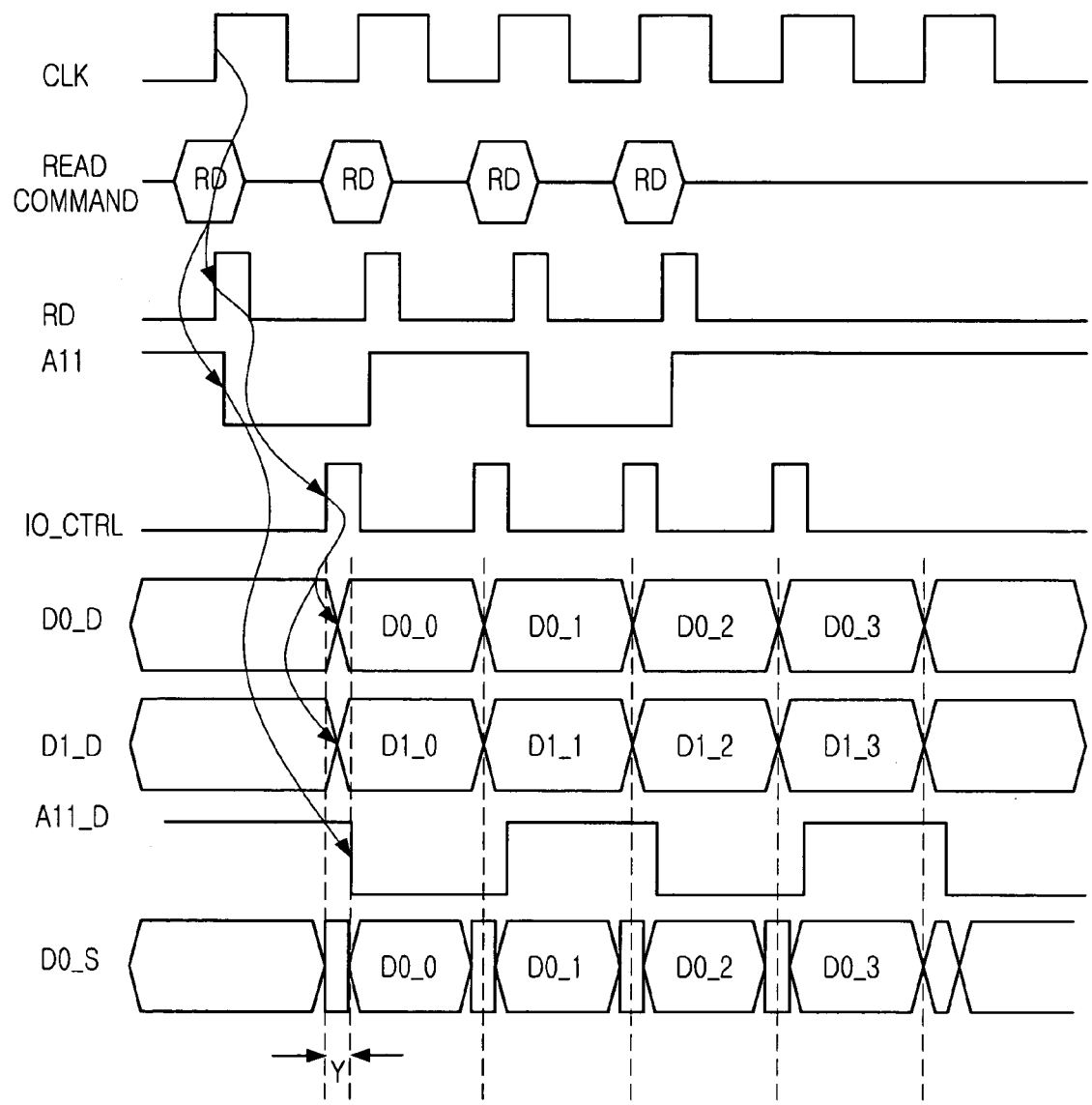
Figure 6:
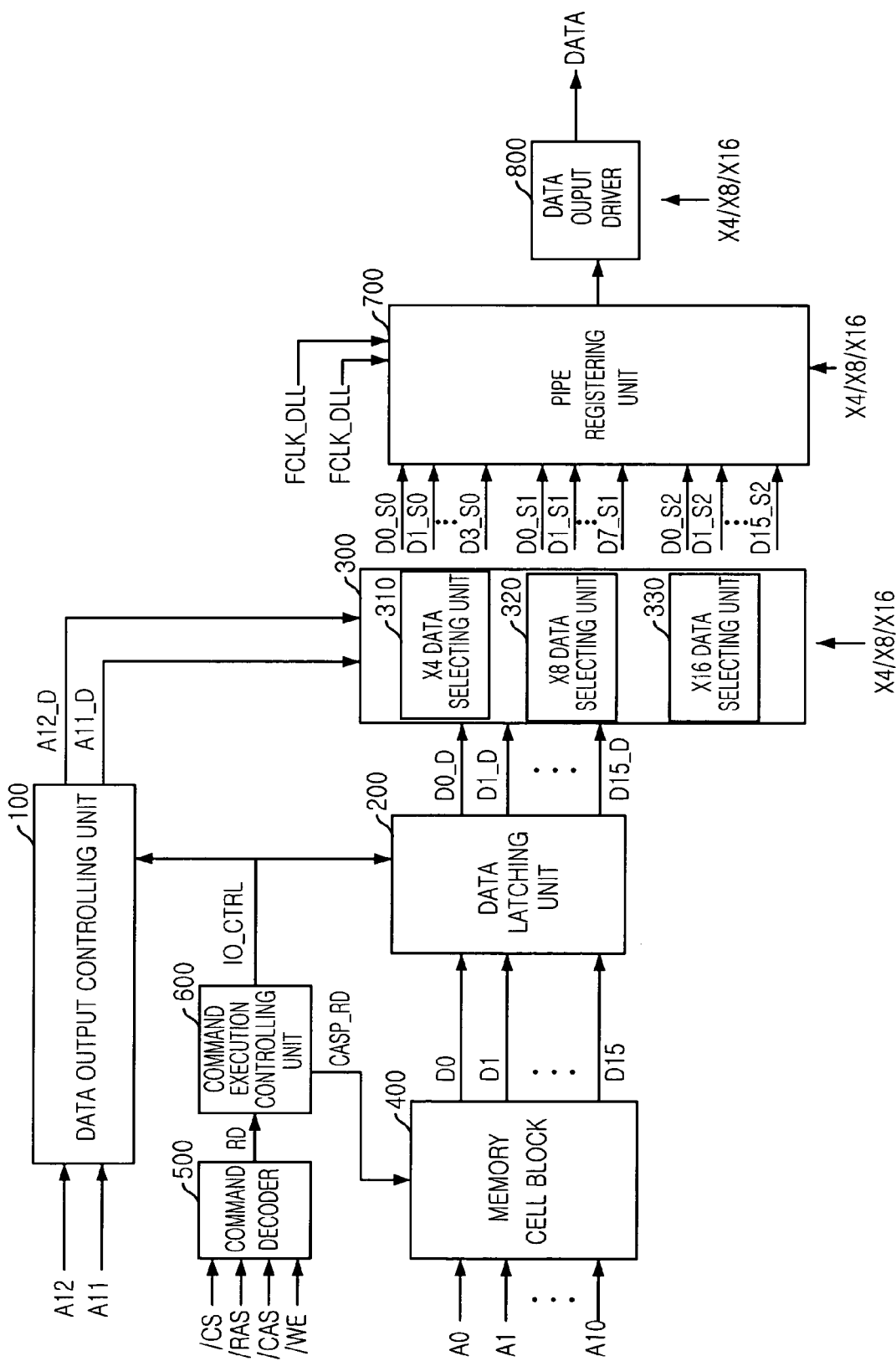
FIG. 6 is a block diagram showing the semiconductor memory device in accordance with the present invention.

FIG. 6 is a block diagram showing the semiconductor memory device in accordance with the present invention.

The semiconductor memory device includes a data output controlling unit 100, a data latching unit 200, a data selection unit 300, a memory cell block 400, a command decoder 500, a command execution controlling unit 600, a pipe registering unit 700 and a data output driver 800.

The command decoder 500 receives and decodes a chip selection bar signal /CS, a row address strobe bar signal /RAS, a column address strobe bar signal /CAS and a write enable bar signal /WE in order to output a read command signal RD.

The command execution controlling unit 600 generates a read command execution signal CASP_RD and a data output control signal IO_CTRL in response to the read command signal RD outputted from the command decoder 500.

The memory cell block 400, having a plurality of memory cells, outputs first to sixteenth data signals D0 to D15 in response to the read command execution signal CASP_RD.

The data latching unit 200 latches the first to sixteenth data signals D0 to D15 outputted from the memory cell block 400 and outputs the first to sixteenth data signals D0 to D15 as first to sixteenth delayed data signals D0_D to D15_D.

The data output controlling unit 100 receives twelfth and thirteenth address signals A11 and A12 to output a first delayed address signal A11_D and a second delayed address signal A12_D. The first and second delayed address signals A11_D and A12_D are used as control signals for the data selection unit 300.

Herein, the semiconductor memory device receives first to thirteenth address signals A0 to A12. The twelfth and thirteenth address signals A11 and A12 are used for the data output controlling unit 100, and the first to eleventh address signals A0 to A10 are used for the memory cell block 400.

The data selection unit 300 receives the first to sixteenth delayed data signals D0_D to D15_D and selects 4, 8 or 16 signals from the received signals depending on the twelfth and thirteenth address signals A11 and A12, and a data mode selection signal X4/X8/X16. The data selection unit 300 includes an X4 data selecting unit 310, an X8 data selecting unit 320 and an X16 data selecting unit 330 for use in an X4 mode, in an X8 mode and in an X16 mode respectively.

The pipe registering unit 700 receives first to fourth selected X4 data signals D0_S0 to D3_S0 at the X4 mode, or receives first to eighth selected X8 data signals D0_S1 to D7_S1 at the X8 mode, or receives first to sixteenth X16 data signals D0_S2 to D15_S2 at the X16 mode. Then, the pipe registering unit 700 outputs the received signals in synchronization with a first delay locked loop (DLL) clock signal FCLK_DLL and a second DLL clock signal RCLK_DLL.

The data output driver 800 receives outputted signals from the pipe registering unit 700 to output the received signals to outside of the semiconductor memory device.

Figure 7:
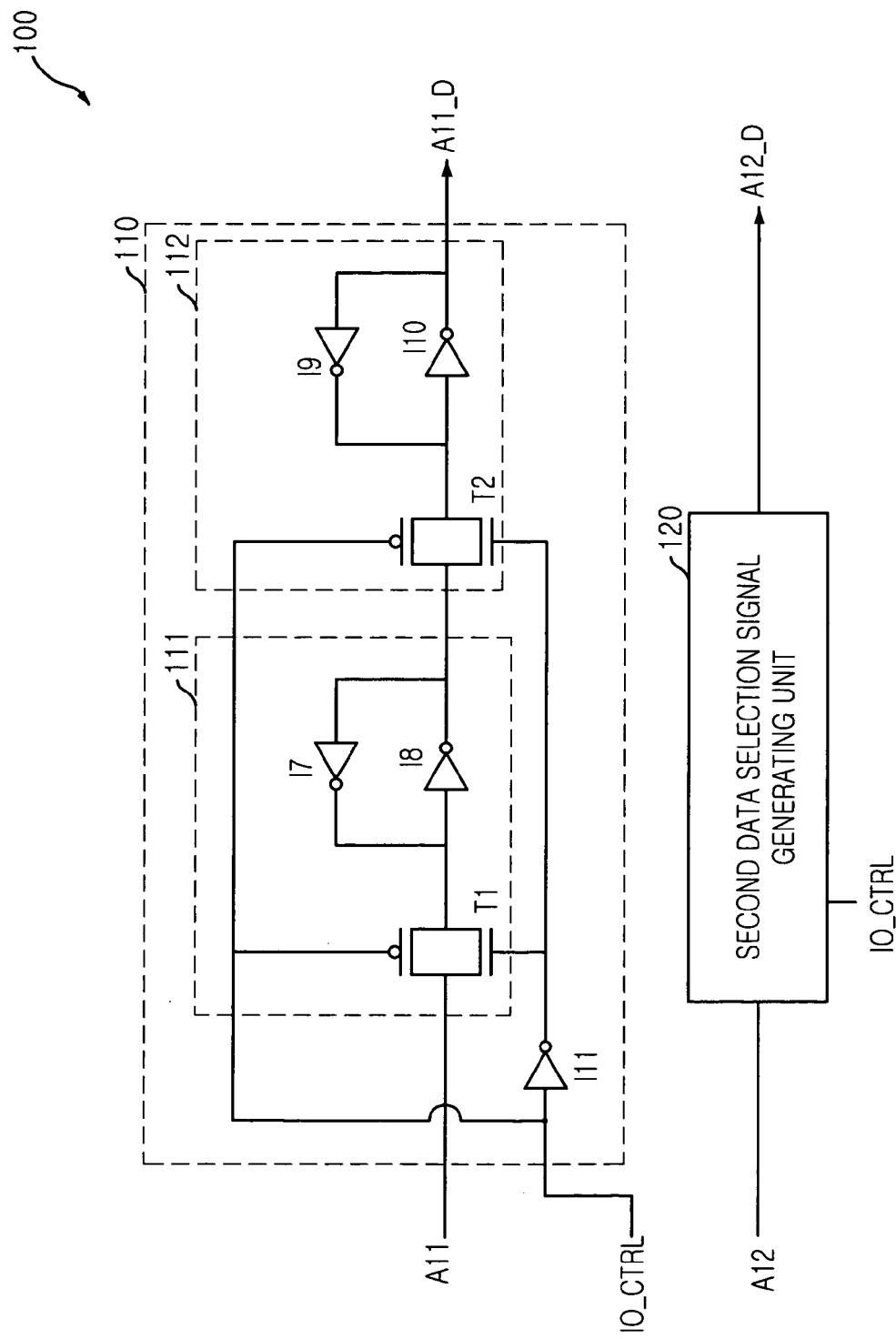
FIG. 7 is a schematic circuit diagram depicting a data output controlling unit shown in FIG. 6.

FIG. 7 is a schematic circuit diagram depicting the data output controlling unit 100 shown in FIG. 6.

As shown, the data output controlling unit 100 includes a first data selection signal generating unit 110 and a second data selection signal generating unit 120.

The first delayed address signal A11_D outputted from the first data selection signal generating unit 110 is used at the X8 mode to select signals from the first to sixteenth delayed data signals D0_D to D15_D. That is, at the X8 mode, eight signals have to be selected from the first to sixteenth delayed data signals D0_D to D15_D. Therefore, the X8 data selecting unit 320 selects one signal from the first and second delayed data signals D0_D and D1_D, and selects one from the third and fourth delayed data signals D2_D and D3_D and so on depending on the first delayed address signal A11_D.

At the X4 mode, four signals have to be selected from the first to sixteenth delayed data signals D0 to D15, thereby both of the first delayed address signal A11_D and the second delayed address signal A12_D are used. That is, the X4 data selecting unit 310 selects one from the first to fourth delayed data signals D0_D to D3_D, and selects one from the fifth to eighth delayed data signals D4_D to D7_D and so on depending on the first delayed address signal A11_D and the second delayed address signal A12_D.

Those two data selection signal generating units have the same structure. Herein, the structure of the first data selection signal generating unit 110 is shown in FIG. 7.

The structure of the first data selection signal generating unit 110 and its operation is described below assuming the semiconductor memory device is in the X8 mode.

The first data selection signal generating unit 110 includes a first control signal latching unit 111 and a second control signal latching unit 112.

The first control signal latching unit 111 receives the twelfth address signal A11 when the data output control signal IO_CTRL is inactivated to a logic 'LOW' level. Then, the second control signal latching unit 112 latches the twelfth address signal A11 from the first control signal latching unit 111 at a timing when the IO_CTRL is transited from a logic 'LOW' level to a logic 'HIGH' level in order to output the first delayed address signal A11_D.

The first control signal latching unit 111 includes a first inverter I7, a second inverter I8 and a first transferring gate T1.

The first transferring gate T1 is turned on when the data output control signal IO_CTRL is inactivated to a logic 'LOW' level, and transfers the twelfth address signal A11 to the first and second inverters I7 and I8. The first and second inverters I7 and I8 form a latch to hold the twelfth address signal A11 transferred by the first transferring gate T1.

The second control signal latching unit 112 includes a third inverter I9, a fourth inverter I10 and a second transferring gate T2.

The second transferring gate T2 is turned on when the data output control signal IO_CTRL is activated to a logic 'HIGH' level, and transfers the twelfth address signal A11 outputted from the first control signal latching unit 111 to the third and fourth inverters I9 and I10. The third and fourth inverters I9 and I10 form a latch to hold and output the twelfth address signal A11 transferred by the second transferring gate T2.

Figure 8:
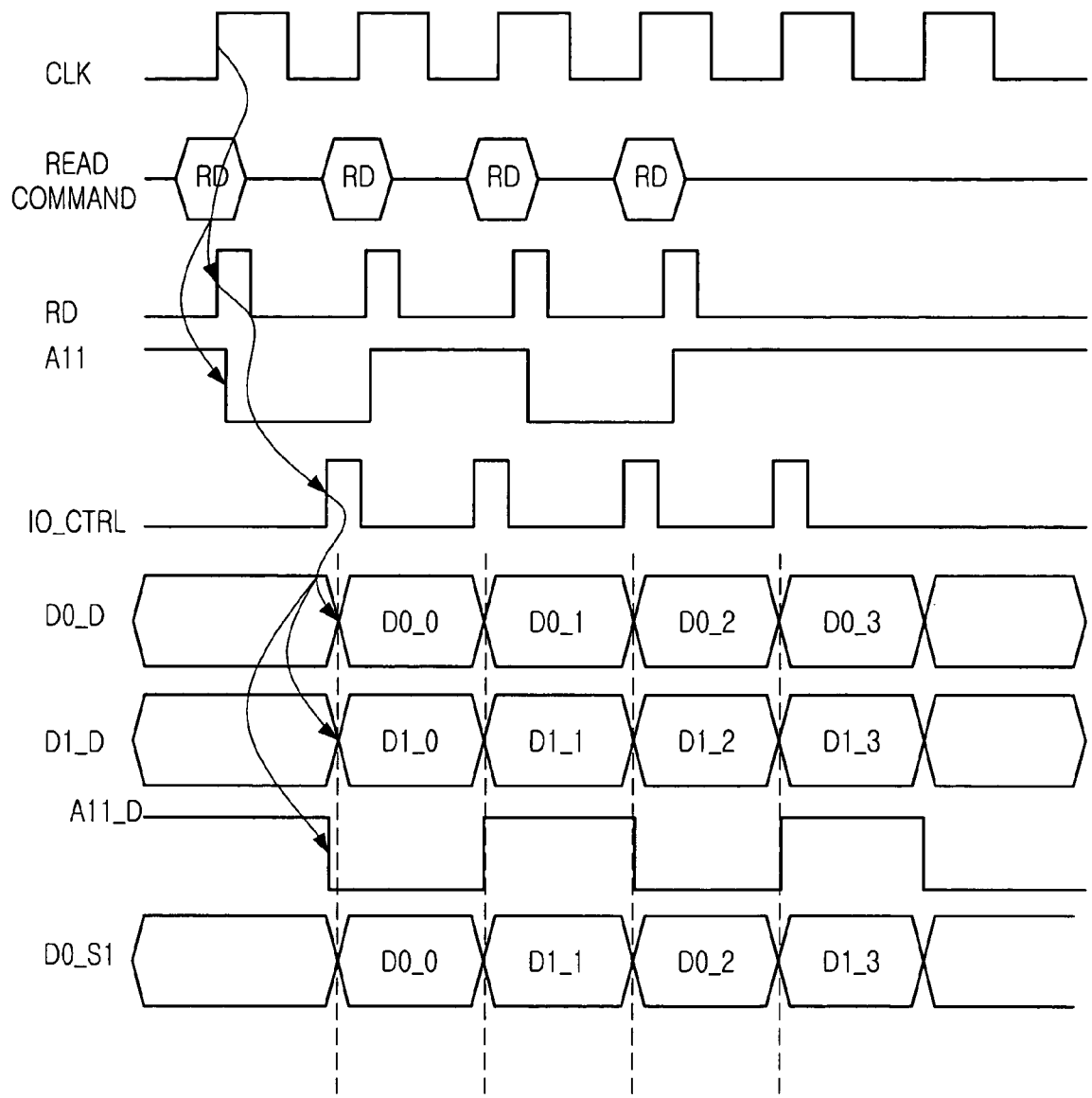
FIG. 8 is a timing diagram showing an operation of the semiconductor memory device in accordance with the present invention.

FIG. 8 is a timing diagram showing an operation of the semiconductor memory device in accordance with the present invention.

Hereinafter, the operation of the semiconductor memory device is described referring to FIGS. 6 to 8 and assuming that the semiconductor memory device is in the X8 mode.

The command decoder 500 decodes inputted command signals to generates the read command signal RD. Then, the command execution controlling unit 600 generates the data output control signal IO_CTRL and the read command execution signal CASP_RD in response to the read command signal RD.

The memory cell block 400 outputs the first to sixteenth data signals D0 to D15 in response to the read command execution signal CASP_RD and the first to eleventh address signals A0 to A10.

The data latching unit 200 latches and outputs the first to sixteenth data signals D0 to D15 in response to the data output control signal IO_CTRL. The data latching unit 200 also amplifies the first to sixteenth data signals D0 to D15 because a signal power of the D0 to D15 is lessen while the D0 to D15 are transferred to the data latching unit 200.

The data output controlling unit 100 latches the twelfth and thirteenth address signals A11 and A12 when the data output control signal IO_CTRL is inactivated to a logic 'LOW' level, then outputs the latched address signals as the first and second delayed address signals A11_D and A12_D when the data output control signal IO_CTRL is activated to a logic 'HIGH' level. Herein, the first delayed address signals A11_D is used at the X8 word mode, or both of the first and second delayed address signals A11_D and A12_D are used at the X4 mode.

Referring to FIG. 8, since the first delayed address signal A11_D is generated in response to the data output control signal IO_CTRL, the A11_D is synchronized with the IO_CTRL.

Therefore, the data selection unit 300 can output its data signals at the same timing when the data latching unit 200 outputs its data signals.

Therefore, the data selection unit 300 has an enough margin of time for outputting its data signals, thereby there's no skew between outputted data from the data latching unit 200 and outputted data from the data selection unit 300.

In addition, even though operational conditions such as a thermometer and a voltage level are changed, the data selection unit 300 can have an enough margin of time to output its data signals.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    at least one memory cell block which has a plurality of memory cells and outputs a plurality of data signals according to a read command signal;
    a data latching unit for latching the plurality of data signals to thereby output the plurality of data signals when a data output control signal, generated based on the read command signal, is activated;
    a data selection unit for selecting a predetermined number of data signals among the plurality of data signals according to a data selection signal; and
    a data output control unit for receiving a plurality of address signals to thereby generate the data selection signal based on the data output control signal.

2. The semiconductor memory device as recited in claim 1, further comprising a command execution controlling unit for generating the data output control signal according to the read command signal.

3. The semiconductor memory device as recited in claim 1, wherein the data output control unit includes a plurality of data selection signal generators, each including:
    a first control signal latching unit for latching and outputting a first control signal according to the data output control signal; and
    a second control signal latching unit for latching and outputting an output of the first control signal latching unit according to the data output control signal to thereby generate the data selection signal.

4. The semiconductor memory device as recited in claim 3, wherein the first control signal is one of the plurality of address signals.

5. The semiconductor memory device as recited in claim 3, wherein the first control signal latching unit includes:
    a first transferring gate which is turned on for transferring the first control signal in response to the data output control signal; and
    a first latch for latching the first control signal from the first transferring gate.

6. The semiconductor memory device as recited in claim 5, wherein the second control signal latching unit includes:
    a second transferring gate which is turned on for transferring the output from the first control signal latching unit in response to the data output control signal; and
    a second latch for latching an output of the second transferring gate to thereby output the output of the second transferring gate as the data selection signal.

* * * * *